United States Patent
Suh et al.

(10) Patent No.: US 7,632,417 B2
(45) Date of Patent: Dec. 15, 2009

(54) METHOD FOR FORMING NANOSTRUCTURE HAVING HIGH ASPECT RATIO AND METHOD FOR FORMING NANOPATTERN USING THE SAME

(75) Inventors: Kahp-Yang Suh, Seoul (KR); Hoon-Eui Jeong, Seoul (KR)

(73) Assignee: Seoul National University Industry Foundation, Seoul (KR)

( * ) Notice: Subject to any disclaimer, the term of this patent is extended or adjusted under 35 U.S.C. 154(b) by 125 days.

(21) Appl. No.: 11/163,997

(22) Filed: Nov. 7, 2005

(65) Prior Publication Data

US 2008/0000871 A1   Jan. 3, 2008

(30) Foreign Application Priority Data

Aug. 29, 2005   (KR) ...................... 10-2005-0079182

(51) Int. Cl.
*C23F 1/00* (2006.01)
*B44C 1/22* (2006.01)

(52) U.S. Cl. ................. 216/2; 216/33; 216/41; 216/52; 257/E21.038

(58) Field of Classification Search .................. None
See application file for complete search history.

(56) References Cited

U.S. PATENT DOCUMENTS

| | | | |
|---|---|---|---|
| 5,259,926 A | 11/1993 | Kuwabara | |
| 5,298,367 A | 3/1994 | Hoessel | |
| 5,772,905 A | 6/1998 | Chou | |
| 6,355,198 B1 | 3/2002 | Kim | |
| 6,528,807 B1 | 3/2003 | Koops et al. | |
| 6,558,868 B2 | 5/2003 | Warren | |
| 6,638,895 B1 | 10/2003 | Karapetrov | |
| 6,686,184 B1 | 2/2004 | Anderson | |

(Continued)

FOREIGN PATENT DOCUMENTS

| | | |
|---|---|---|
| JP | 2000194142 | 7/2000 |
| JP | 2003077807 | 3/2003 |
| KR | 10200193616 | 10/2001 |

OTHER PUBLICATIONS

"Nanoimprint lithography", Journal of Vacuum Science & Technology B (1996), Chou, S. Y., pp. 4129-4133.
"Nanomolding based fabrication of synthetic gecko foot-hairs", IEEE-NANO (2002), Mettin Sitti, pp. 137-140.

(Continued)

*Primary Examiner*—Allan Olsen
(74) *Attorney, Agent, or Firm*—IPLA P.A.; James E. Bame

(57) ABSTRACT

Provided is a method of forming a nanostructure having a nano-sized diameter and a high aspect ratio through a simple and economical process. To form the nanostructure, a polymer thin film is formed on a substrate and a mold is brought to contact the polymer thin film. Then, a polymer patterning is formed to contact the background surface of an engraved part of the mold, and then the polymer pattern is extended out by removing the mold out of the polymer thin film. The nanostructure forming method of the present research can reproduce diverse cilia optimized in the natural world. Also, it can be used to develop new materials with an ultra-hydrophobic property or a high adhesiveness. Further, it can be applied to a nanopattern forming process for miniaturizing electronic devices and to various ultra-precise industrial technologies together with carbon nanotube, which stands in the highlight recently.

7 Claims, 7 Drawing Sheets

U.S. PATENT DOCUMENTS

| | | | |
|---|---|---|---|
| 6,719,915 B2 | 4/2004 | Wilson | |
| 6,961,186 B2* | 11/2005 | Pierrat et al. | 359/649 |
| 7,157,036 B2* | 1/2007 | Choi et al. | 264/264 |
| 2002/0167117 A1* | 11/2002 | Chou | 264/338 |
| 2004/0182820 A1* | 9/2004 | Motowaki et al. | 216/44 |
| 2004/0256764 A1* | 12/2004 | Choi et al. | 264/293 |
| 2006/0046069 A1* | 3/2006 | Jung et al. | 428/429 |
| 2006/0173125 A1* | 8/2006 | Lawson et al. | 524/571 |
| 2006/0183395 A1* | 8/2006 | Xu et al. | 445/50 |
| 2006/0214330 A1* | 9/2006 | Dumond et al. | 264/320 |
| 2006/0237881 A1* | 10/2006 | Guo et al. | 264/496 |
| 2006/0279024 A1* | 12/2006 | Choi et al. | 264/334 |
| 2007/0059497 A1* | 3/2007 | Huang et al. | 428/195.1 |

OTHER PUBLICATIONS

"Step and flash imprint lithography", Journal of Vacuum Science & Technology B(2000), Bailey, T., pp. 3572-3577.

"Polymer Microstructures Formed by Moulding in Capillaries", Nature (1995), Kim, E., pp. 581-584.

"Soft Lithography", Annu. Rev.Mater. Sci, (1998), Xia, Y. N., pp. 153-184.

* cited by examiner

METHOD FOR FORMING NANOSTRUCTURE HAVING HIGH ASPECT RATIO AND METHOD FOR FORMING NANOPATTERN USING THE SAME

BACKGROUND OF THE INVENTION

1. Field of the Invention

The present invention relates to a method of forming a nanostructure having a high aspect ratio and a method of forming a nanopattern by using the same; and more particularly, to a high-aspect ratio nanostructure forming method with simplified processing and excellent economical efficiency, and a nanopattern forming method using the same.

2. Description of the Related Art

The major trend in manufacturing of industrial parts since 1980s has been miniaturization, and this calls for the development of nano-sized structures, which will be referred to as nanostructures hereinafter. To meet the demand, there are many techniques introduced for easily and economically forming reliable nanostructures.

One of the representative methods for forming a nanostructure is nanoimprint lithography, which is disclosed in U.S. Pat. No. 5,772,905. To describe the technique in detail, a hard mold having a nano-sized pattern is formed by using electron beam lithography first and a substrate is coated with a polymer compound and heated to thereby have flexibility. Then, the hard mold is pressed under a strong pressure of about 1,900 psi to thereby form a nanostructure.

The nanoimprint lithography has an advantage that structures as small as tens of nanometers can be formed by using a mold of a high hardness. However, since the method requires a mold of a high hardness and high pressure, it is difficult to form patterns by using an engraved mold or molds having patterns of diverse sizes and to form a pattern in a wide area. Most of all, the nanoimprint lithography has a shortcoming that it is hard to form a structure having a high aspect ratio.

To resolve the problems, researchers have been developed diverse soft lithography techniques using relatively soft and elastic molds instead of using a hard mold. One of the soft lithography techniques is microcontact printing. According to the microcontact printing, a mold having a pattern is formed and the mold is coated with a chemical called polydimethylsiloxane (PDMS) on the embossments, and then the mold is pushed down on a substrate to thereby form a pattern. This method is similar to stamping a seal.

The microcontact printing has an advantage that it can form a desired pattern without leaving any remaining layer on the substrate. However, since the method should use a chemical material, i.e., PDMS, there is a shortcoming that it cannot form a structure having a high aspect ratio.

Another example of the soft lithography techniques is micromolding in capillaries (MIMIC), which is disclosed in U.S. Pat. No. 6,355,198. According to the MIMIC, a PDMS mold having a pattern is positioned in a substrate and a three-dimensional structure of a micrometer size is formed by flowing a fluid from the sidewall of the mold. When the MIMIC is repeated in several layers, a high three-dimensional structure can be formed. However, since multiple layers of molds should be arranged precisely to form a reliable structure having a high aspect ratio, the process is difficult and complicated.

Besides, there are other diverse soft lithography techniques. Most of them have an advantage that, since an elastic PDMS mold having a low hardness is used, a three-dimensional microstructure can be formed in a wide area, but they have a conclusive limitation that they can hardly form a nano-sized structure.

Meanwhile, another method of forming a nanostructure having a high aspect ratio is atomic force microscope lithography. The atomic force microscope lithography forms a nanostructure having a high aspect ratio by operating a probe of an atomic force microscope and contacting the probe with polymer physically. Although the method has an advantage that delicate structure can be formed, it has a shortcoming that the process is remarkably slow because every single structure should be formed with the probe and, accordingly, it can be hardly applied to a wide area.

Other nanostructure forming methods include Micro Electro Mechanical system (MEMS) processing, Deep Reactive Ion Etching System (DRIE), and conventional light exposure processing such as electron beam lithography and photolithography. Most of the methods have been used for the fabrication of semiconductors conventionally. Although there are more or less differences, they require a light exposure process in common. Therefore, they have shortcomings that they should use multiple sheets of masks, that the process is complicated and takes long time, and that they require a high amount of costs.

SUMMARY OF THE INVENTION

Accordingly, the present invention is directed to a method of forming a nanostructure having a high aspect ratio that substantially obviates one or more problems due to limitations and disadvantages of the related art.

It is one object of the present invention to provide a method of forming a structure having a nano-sized diameter and a high aspect ratio through a simple and economical process.

It is another object of the present invention to provide a method of forming a nanopattern using the method of forming a structure having a nano-sized diameter and a high aspect ratio.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In one aspect of the present invention, there is provided a method of forming a nanostructure, including: forming a polymer thin film on a substrate; contacting a mold with the polymer thin film; forming a polymer pattern contacting a background surface of an engraved part of the mold by making the polymer thin film flow; and forming a nanostructure with the polymer pattern extended out by removing the mold out of the polymer thin film with the polymer pattern formed thereon.

In another aspect of the present invention, there is provided a method of forming a nanopattern, including: forming a polymer thin film on a substrate; contacting a pattern of a mold with the polymer thin film; forming a polymer pattern contacting a background surface of an engraved part of the mold by making the polymer thin film flow; forming a nanostructure with the polymer pattern extended out by removing the mold out of the polymer thin film with the polymer pattern formed thereon; forming a nanopattern on the substrate by using the extended nanostructure as a mask and etching the substrate; and removing the nanostructure out of the substrate with the nanopattern formed thereon.

The method according to the present invention forms a nanostructure having a high aspect ratio through a simple process. Thus, the method according to the present invention can be applied to diverse fields requiring the formation of a nanostructure having a high aspect ratio and improve the processing and economical efficiencies of the fields.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. However, the present invention is not limited to the embodiments illustrated herein after, and the embodiments herein are rather introduced to provide easy and complete understanding of the scope and spirit of the present invention.

FIGS. 1 to 4 are cross-sectional views showing a method of forming a nanostructure having a high aspect ratio according to an embodiment of the present invention. The method will be described in detail hereinafter.

Figure 1:
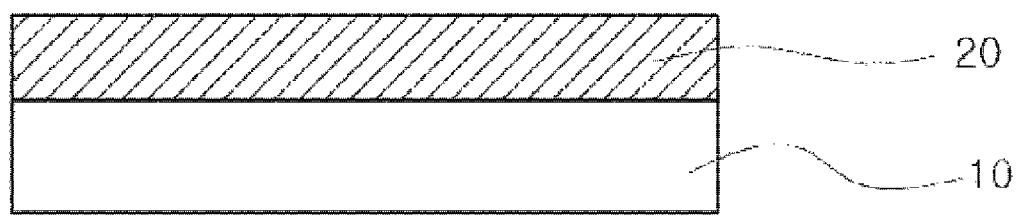
FIGS. 1 to 4 are cross-sectional views describing a method of forming a nanostructure having a high aspect ratio according to an embodiment of the present invention.

Referring to FIG. 1, in operation S10, a polymer thin film 20 is formed on a substrate 10. The substrate 10 may be a silicon substrate, a metal substrate, a polymer substrate, or a glass substrate. For example, the substrate 10 may be a predetermined lower structure in a semiconductor fabrication process. As for the polymer thin film 20, it is preferable to use a thermoplastic resin that may become flowed when heat is applied thereto, such as polystyrene, poly(methyl methacrylate).

The polymer thin film 20 may be formed on the substrate 10 in such a method as spin coating, a method which is widely used to form a thin film.

In the present invention, a nanostructure having a high aspect ratio is formed by controlling surface energies between the substrate 10, the polymer thin film 20, and the mold 30. Therefore, an operation of controlling the surface energy of the substrate 10 by processing the substrate 10 may be performed before the polymer thin film 20 is formed on the substrate 10 in operation S10. The surface energy relationship between the substrate 10, the polymer thin film 20, and the mold 30 will be described later.

Figure 2:
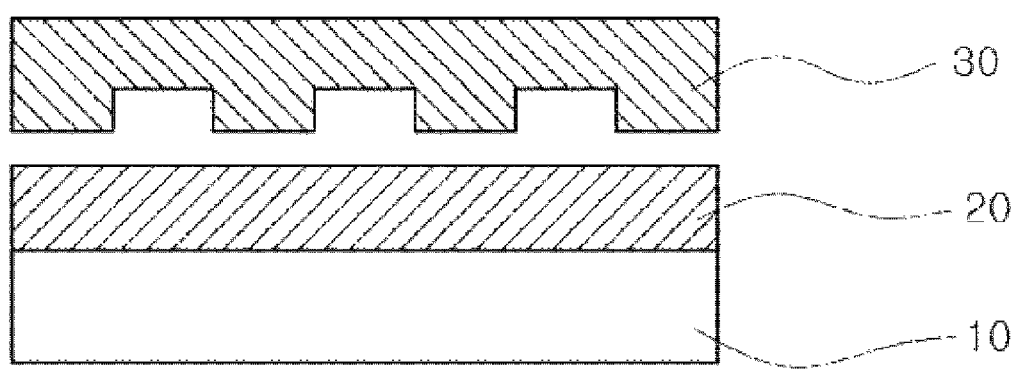

Referring to FIG. 2, in operation S20, the polymer thin film 20 is brought to a contact with the mold 30.

As for the mold 30, it is possible to use polymers such as polyurethane and poly-dimethylsiloxane (PDMS), and inorganic materials such as silicon dioxide ($SiO_2$) individually or by mixing more than two of them.

It is preferable that the polymer thin film 20 evenly contacts the pattern surface of the mold 30 by applying a predetermined level of pressure to the mold 30, after the polymer thin film 20 contacts the mold 30. Preferably, the pressure applied to the mold 30 is in the range of about 0.1 to 10 atmospheric pressure. When the pressure is lower than 0.1 atmospheric pressure, it is hard to expect an effect of promoting a capillary action by evenly contacting the polymer thin film 20 with the patterned surface of the mold 30. Also, when the pressure exceeds 10 atmospheric pressure, a nanopattern is not formed by the capillary action, which is intended to be formed in the present invention, but it is formed by the pressure just as conventional technologies do. In this case, it becomes hard to form a nanostructure having a high aspect ratio.

Also, when the polymer thin film 20 has a low fluidity at a room temperature, it is possible to additionally perform an operation of securing fluidity of the polymer thin film 20 by heating up the polymer thin film 20 at a temperature higher than a glass-transition temperature (Tg) of a material that forms the polymer thin film 20.

As described above, the mold can be imprinted on the polymer pattern based on the capillary phenomenon or pressing, which will be described later, by improving the evenness in contact between the polymer thin film 20 and the mold 30 with pressure or by heating up the polymer thin film 20 to thereby secure fluidity.

Optionally, it is possible to additionally perform an operation of controlling the surface energy of the mold 30 by treating the surface of the mold 30 before the polymer thin film 20 contacts the mold 30.

Figure 3:
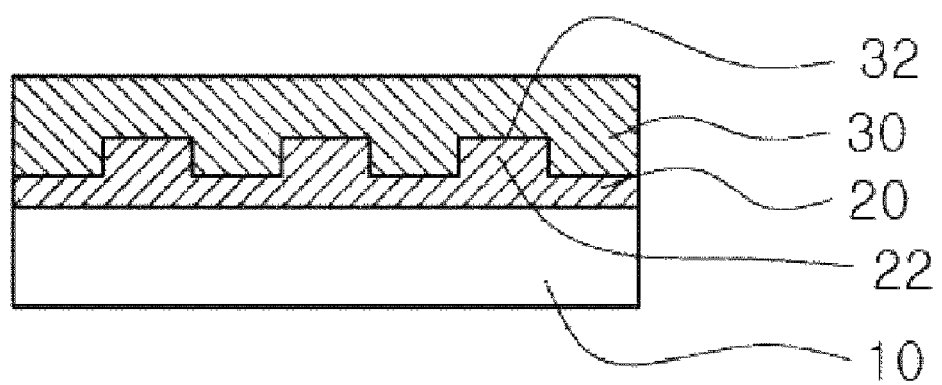

Referring to FIG. 3, in operation S30, a polymer pattern 22 contacting a background surface 32 of the engraved part of the mold 30 by flowing the polymer thin film 20.

Generally, most thermoplastic polymers have a glass-transition temperature (Tg), at which the polymers take on the characteristics of liquid and come to have fluidity. Herein, when a mold, i.e., prototype, having a pattern that can draw up the polymer contacts the polymer, the polymer moves along the pattern of the mold due to the capillary phenomenon.

In the present operation, the vacant part of the mold 30, i.e., the engraved part, is filled up with the polymer thin film 20 based on the capillary phenomenon and the polymer thin film 20 is brought to contact the background surface 32 of the engraved part.

To be specific, when the material that forms the polymer thin film 20 has fluidity at a room temperature, the polymer pattern 22 can be formed by closely contacting the mold 30 with the polymer thin film 20 to thereby induce the capillary phenomenon. If the material does not have fluidity at a room temperature, the capillary phenomenon can be induced by performing a thermal process at a predetermined temperature, which is described in the above. Further, if the polymer material that forms the polymer thin film 20 does not have fluidity, it is possible to cause the capillary phenomenon by absorbing (or permeating) a solvent into the polymer thin film 20 to thereby secure fluidity.

In addition, it is possible to position the substrate 10 with the polymer thin film 20 in the upper part and the mold 30 in the lower part in order to promote the polymer thin film 20 filling the engraved part of the mold 30.

As described above, the polymer thin film 20 fills up the engraved part of the mold 30 and, finally, it comes to contact the background surface 32 of the mold 30. When the polymer pattern 22 is formed in the polymer thin film 20 and contacts the background surface 32 of the engraved part, a chemical attraction force is formed in the interface along the surface energy of the polymer pattern 22 and the mold 30. The chemical attraction force is similar to the surface tension of the two materials in contact, but the chemical attraction force is increased as the two materials show similar surface energy for such a reason that they include similar functional groups. In other words, the chemical attraction force between the two materials can be controlled by selecting either the polymer thin film 20 or the mold 30 which has a predetermined surface energy or by adjusting the surface energy of the polymer thin film 20 or the mold 30 through surface treatment.

Figure 4:
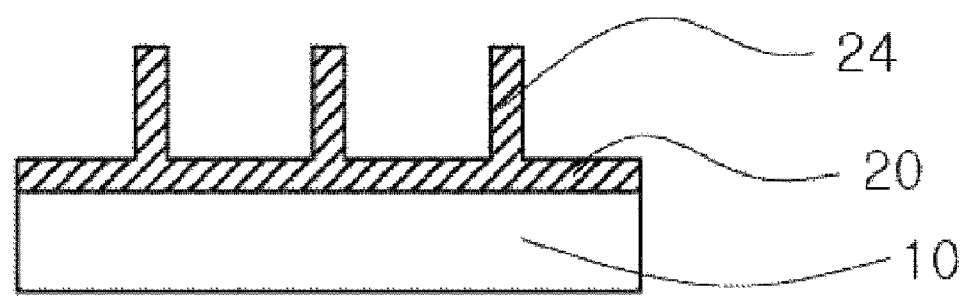

Referring to FIG. 4, in operation S40, a nanostructure 24, which is an extended polymer pattern, having a high aspect ratio is formed by removing the mold 30 out of the polymer pattern 22.

As described before, the chemical attraction force acts between the polymer pattern 22 and the mold 30, the polymer pattern 22 is extended out when the mold 30 is removed and, eventually, a nanostructure 24 having a very high aspect ratio is formed.

Since the polymer thin film 20 having the polymer pattern 22 should not be got off the substrate 10, the polymer thin film 20 or the polymer pattern 22 should have a stronger chemical attraction force with the substrate 10 than with the mold 30. In short, it is desirable that the difference between the surface energies of the polymer thin film 20 and the substrate 10 should be less than the difference between the surface energies of the polymer thin film 20 and the mold 30. Also, the surface energy difference between the polymer thin film 20 and the mold 30 can be a factor on the extent that the polymer pattern 22 is extended.

The materials forming the substrate 10, the polymer thin film 20, and the mold 30 are no more than examples and, basically, any combinations of materials that control the surface energies and the chemical attraction force in the above-described relationship can be selected and used.

According to the embodiment of the present invention, it is possible to easily form a nanostructure having a remarkably high aspect ratio, which is impossible in conventional photolithography process. Since materials having the nanostructure in the surface have a strong hydrophobic property, they can be used for fabricating a functional material with a soil-repellent function. Also, since the high aspect ratio in the surface provides a wide surface area, it can be used to develop materials with remarkably improved surface adhesiveness.

In short, the nanostructure of the present invention can be used not only in the formation of a nanopattern in the semiconductor fabricating process but also in the reproduction of cilia in the natural world.

The present invention also provides a method of forming a nanopattern using the high-aspect ratio nanostructure forming method.

Figure 5:
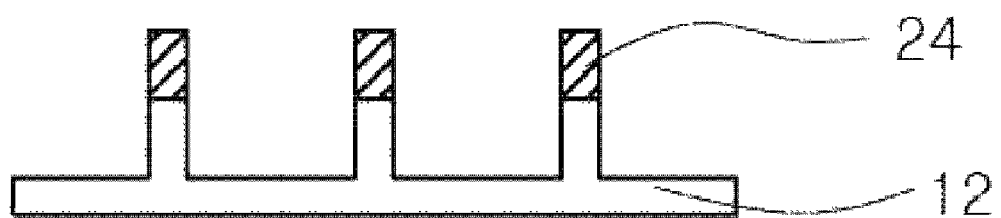
FIGS. 5 and 6 are cross-sectional views illustrating a method of forming a nanopattern according to an embodiment of the present invention.
Figure 6:
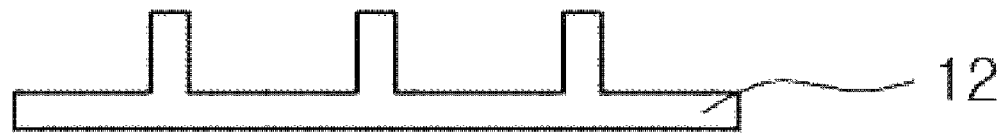

FIGS. 5 and 6 are cross-sectional views illustrating a method of forming a nanopattern according to an embodiment of the present invention.

To be specific, a nanostructure having a high-aspect ratio is formed on a substrate 10 in the above-described method of the operations S10 to S40 to form the nanopattern in the lower substrate 10 by using the nanostructure as a mask. The process of forming the nanostructure will not be repeated herein.

Referring to FIG. 5, in operation S50, the substrate 10 is etched by using the nanostructure 24 as a mask to thereby form a nanopattern 12 on the substrate. To be specific, two-step etching is performed. That is, the polymer thin film 20 with the nanostructure 24 having a high aspect ratio on the substrate 10 is etched out before the substrate 10 is etched.

Herein, since the nanostructure 24 has a distinctive difference in the thickness from a part of the polymer thin film 20 without the nanostructure 24 formed thereon, the part where the nanostructure 24 is formed can be used as the mask. Also, since the nanostructure 24 having a high aspect ratio is used as the mask, diverse structures also having a high aspect ratio can be formed in the lower substrate 10, too.

Referring to FIG. 6, in operation S60, the nanopattern 12 is formed on the substrate by removing the nanostructure 24 from the substrate 12 with the nanopattern formed thereon. Herein, it is desirable to use a method that can optionally remove only the material used for forming the nanostructure 24.

Figure 7:
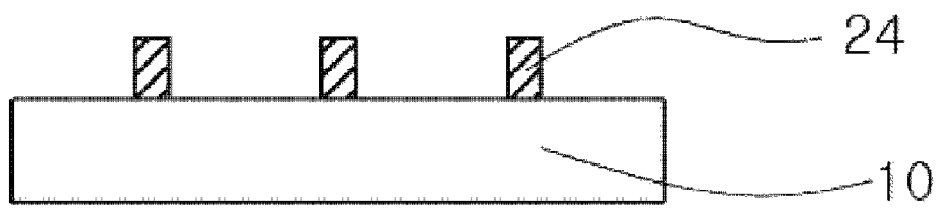
FIG. 7 is a cross-sectional view describing a method of forming a nanopattern according to another embodiment of the present invention.
Figure 8:
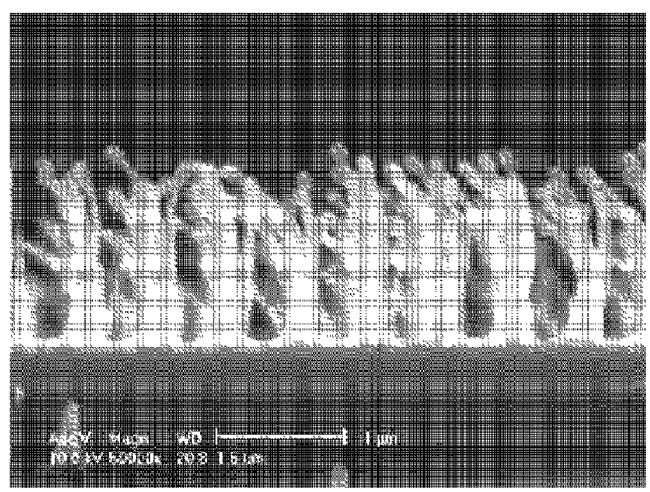
FIGS. 8 to 12 are scanning electron microscope (SEM) photographs showing nanostructures of diverse forms having high aspect ratios according to an embodiment of the present invention.
Figure 9:
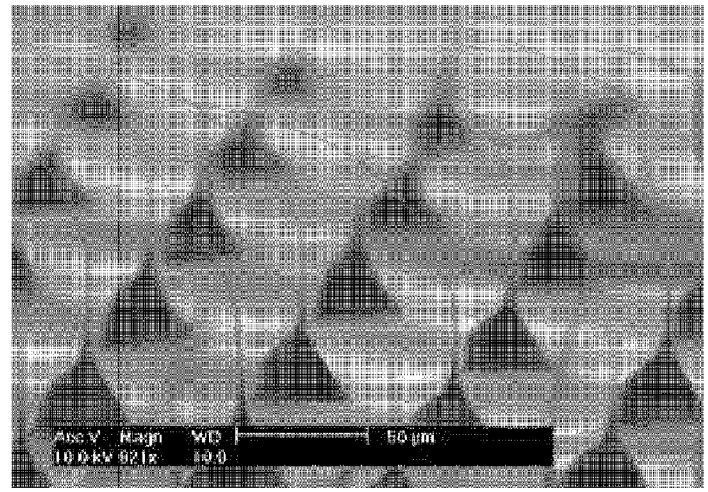
Figure 10:
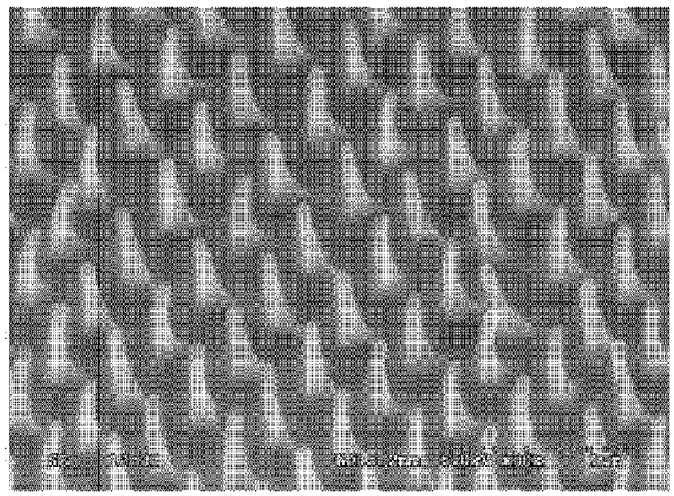
Figure 11:
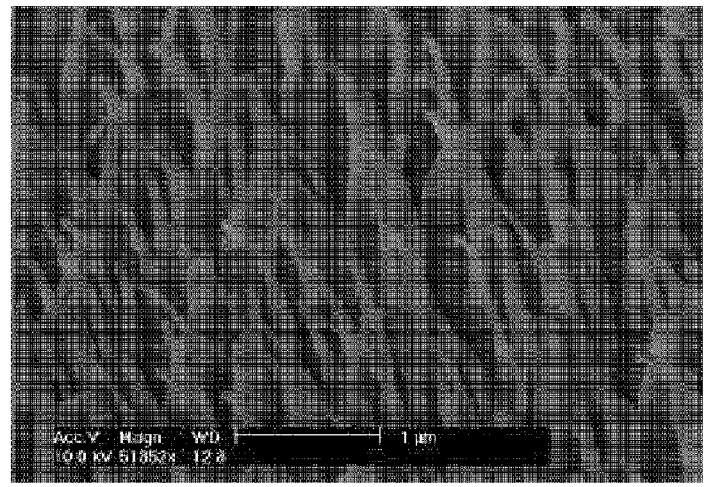
Figure 12:
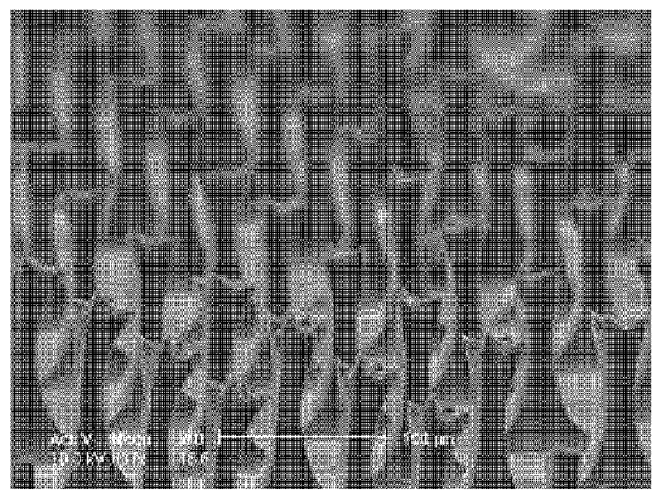

FIG. 7 is a cross-sectional view describing a method of forming a nanopattern according to another embodiment of the present invention.

Referring to FIG. 7, in operation S60, an operation of removing a part where the nanostructure 24 having a high aspect ratio is not formed can be performed optionally before the etching of the substrate 10 of the operation S50.

Differently from a case where the etching is performed on the entire surface of the polymer thin film 20 including the nanostructure 24, this method leaves the nanostructure without damage because it removes the part where the nanostructure 24 is not formed first.

When a pattern is formed in the lower substrate 10 by using the intact nanostructure 24 with a mask, a nanopattern having a high aspect ratio can be formed.

The method described above makes it possible to form diverse electronic circuits and semiconductor device structures which become more multi-layered, precisely and economically.

Hereinafter, the present invention will be described more in detail with reference to an embodiment and a comparative example. The embodiment only exemplifies the present invention but they do not limit the scope of the present invention.

EMBODIMENT

Operation S10: Formation of Polymer Thin Film on Substrate

First, a silicon substrate was washed by ultrasonic waves in an ultrasonic bath containing trichloroethylene (TCE) solution for about five minutes. Then, the silicon substrate was put in an ultrasonic bath containing methanol solution and washed by ultrasonic waves for about five minutes. The silicon substrate was taken out of the ultrasonic bath and rinsed with distilled water. Subsequently, the substrate was coated with a polymer thin film by using 30 wt % polystyrene dissolved in toluene. The coating was carried out in a spin coating method at 3,000 rpm.

Operations S20 and S30: Contact With Mold And Formation of Polymer Pattern

The polymer thin film was brought to a contact with a polyurethane mold having a desired pattern formed therein. The contact was performed evenly in such a manner that the contacting surface does not come off. The polymer thin film and the mold were maintained to contact each other with a low level of pressure to thereby induce capillary phenomenon and went through a thermal treatment at 135° for five hours. During the time, the polystyrene polymer thin film slowly filled the vacant part of the polyurethane mold and eventually it came to contact the background surface of the engraved part of the polyurethane mold.

Operation S40: Formation of Nanostructure Having High Aspect Ratio

A nanostructure having a high aspect ratio was formed by removing the polyurethane mold in the vertical direction. Herein, diverse shape of nanostructures can be formed based on the speed and direction that the polyurethane mold is removed.

FIGS. 8 to 12 are scanning electron microscope (SEM) photographs showing nanostructures of diverse forms having high aspect ratios according to an embodiment of the present invention.

Figure 13:
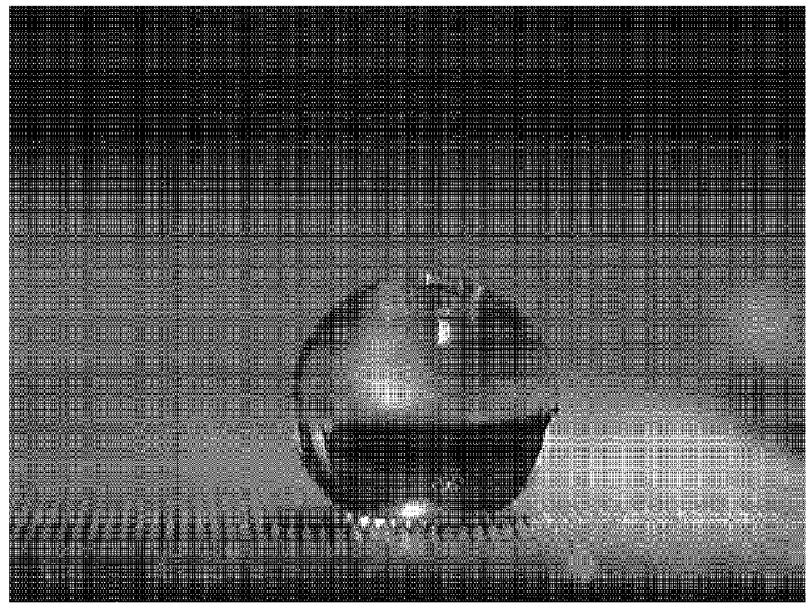
FIG. 13 is a SEM photograph showing a hydrophobic property of a nanostructure having a high aspect ratio which is formed according to an embodiment of the present invention.

FIG. 13 is a SEM photograph showing a hydrophobic property of a nanostructure having a high aspect ratio which is formed according to an embodiment of the present invention.

COMPARATIVE EXAMPLE

The processes of the operations S10 to S20 were performed in the same as the above embodiment, but the polyurethane mold was removed before the polystyrene polymer thin film filled the vacant part of the polyurethane mold and contacted the background part of the engraved part of the polyurethane mold.

Figure 14:
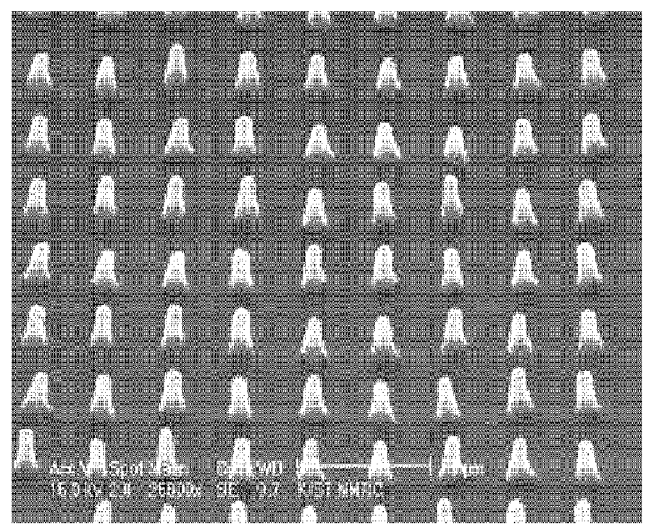
FIG. 14 is a SEM photograph showing a polymer pattern formed according to a comparative example.

FIG. 14 is a SEM photograph showing a polymer pattern formed according to a comparative example.

Referring to FIG. 14, it can be seen that the aspect ratio of the formed structure is decreased remarkably, compared to that of the nanostructure observed in FIGS. 8 to 12.

According to the experimental results, the method of the present invention can form a nanostructure having a high aspect ratio simply and economically, and the method can be applied to the development of materials with an excellent hydrophobic property or strong adhesiveness.

The nanostructure forming method of the present invention can reproduce diverse kinds of optimized cilia in the natural world. To be specific, a frictional resistance or a resisting force on the surfaces of diverse materials can be reduced by reproducing nano-sized cilia. When the technology is used on the surface of vehicles, e.g., cars, especially, on the surfaces of large transferring means, e.g., aircrafts, vessels and bathyscaphes, fuel costs can be reduced considerably.

Also, the technology suggested in the present invention can make a contribution to the development of new functional materials having ultrahydrophobic property or high adhesiveness by using the nanostructure forming method of the present invention. Specifically, materials with self-cleaning function or anti-humidity function, such as exterior finishing materials for buildings, household/industrial high-functional glass, and optical lens, can be manufactured by using the hydrophobic material. In addition, a robot that can move vertically on the walls can be developed with a highly adhesive material. In short, the technology of the present invention can be applied to developments of various industrial technologies, such as national defense, aerospace industry, and industrial robots.

The method of the present invention can be also applied to a nanopattern forming process for miniaturizing electronic devices and contributes to the development of ultra-precise industry technologies along with carbon nanotube, which comes to stand in the highlight recently.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of forming a nanostructure having a high aspect ratio, comprising:
    forming a polymer thin film on a substrate;
    contacting a mold with the polymer thin film evenly by applying 0.1 to 10 atmospheric pressure to the mold;
    forming a polymer pattern contacting a background surface of an engraved part of the mold by making the polymer thin film flow based on the capillary phenomenon; and
    forming a nanostructure with the polymer pattern extended out by removing the mold out of the polymer thin film with the polymer pattern formed thereon,
    wherein a surface energy difference between the substrate and the polymer thin film is less than a surface energy difference between the polymer thin film and the mold, and an extent of the extension of the polymer pattern is controlled by adjusting the surface energy difference between the polymer thin film and the mold.

2. The method of claim 1, wherein the polymer thin film comprises thermoplastic resin.

3. The method of claim 1, wherein the mold comprises one selected from the group consisting of polyurethane, polydimethylsiloxane (PDMS), and silicon dioxide(SiO2).

4. The method of claim 1, wherein the making the polymer thin film flow is performed by heating up the polymer thin film.

5. The method of claim 1. further comprising controlling a surface energy of the substrate by performing a surface treatment on the substrate before the forming of the polymer thin film.

6. The method of claim 1, further comprising controlling a surface energy of the mold by performing a surface treatment on the mold before the contacting a mold with the polymer thin film.

7. The method of claim 1, furthering comprising improving contact evenness between the polymer thin film and the mold by applying pressure to the mold after the contacting of the mold.

* * * * *